(12) United States Patent
Hsiao et al.

(10) Patent No.: US 11,121,315 B2
(45) Date of Patent: Sep. 14, 2021

(54) STRUCTURE IMPROVING RELIABILITY OF TOP ELECTRODE CONTACT FOR RESISTANCE SWITCHING RAM HAVING CELLS OF VARYING HEIGHT

(71) Applicant: Taiwan Semiconductor Manufacturing Co., Ltd., Hsin-Chu (TW)

(72) Inventors: Cheng-Tai Hsiao, Tainan (TW); Sheng-Chau Chen, Tainan (TW); Hsun-Chung Kuang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 23 days.

(21) Appl. No.: 16/733,378

(22) Filed: Jan. 3, 2020

(65) Prior Publication Data
US 2021/0210681 A1 Jul. 8, 2021

(51) Int. Cl.
*H01L 45/00* (2006.01)
(52) U.S. Cl.
CPC .......... *H01L 45/1253* (2013.01); *H01L 45/06* (2013.01); *H01L 45/1608* (2013.01); *H01L 45/1675* (2013.01)

(58) Field of Classification Search
CPC .............................. H01L 45/1253; H01L 45/06
See application file for complete search history.

(56) References Cited

U.S. PATENT DOCUMENTS

| 2018/0158869 A1* | 6/2018 | Chuang | .................... H01L 43/08 |
| 2020/0111951 A1* | 4/2020 | Dutta | ..................... H01L 27/226 |
| 2020/0350366 A1* | 11/2020 | Chen | .................... H01L 23/5329 |

\* cited by examiner

*Primary Examiner* — Mounir S Amer
(74) *Attorney, Agent, or Firm* — Eschweiler & Potashnik, LLC

(57) ABSTRACT

The problem of forming top electrode vias that provide consistent results in devices that include resistance switching RAM cells of varying heights is solved using a dielectric composite that fills areas between resistance switching RAM cells and varies in height to align with the tops of both the taller and the shorter resistance switching RAM cells. An etch stop layer may be formed over the dielectric composite providing an equal thickness of etch-resistant dielectric over both taller and shorter resistance switching RAM cells. The dielectric composite causes the etch stop layer to extend laterally away from the resistance switching RAM cells to maintain separation between the via openings and the resistance switching RAM cell sides even when the openings are misaligned.

20 Claims, 7 Drawing Sheets

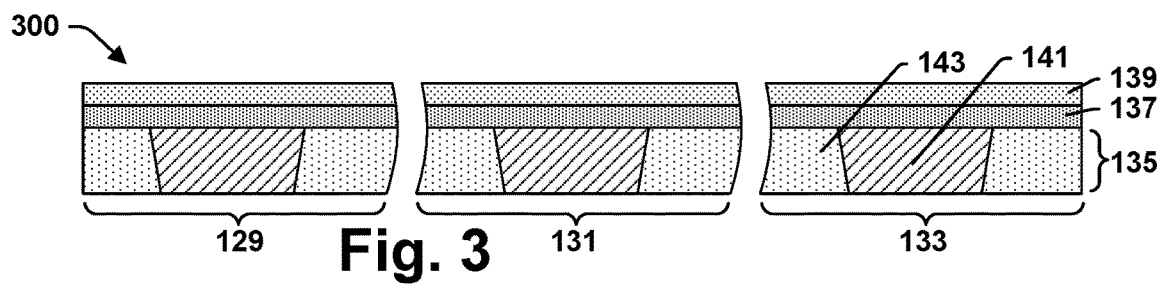
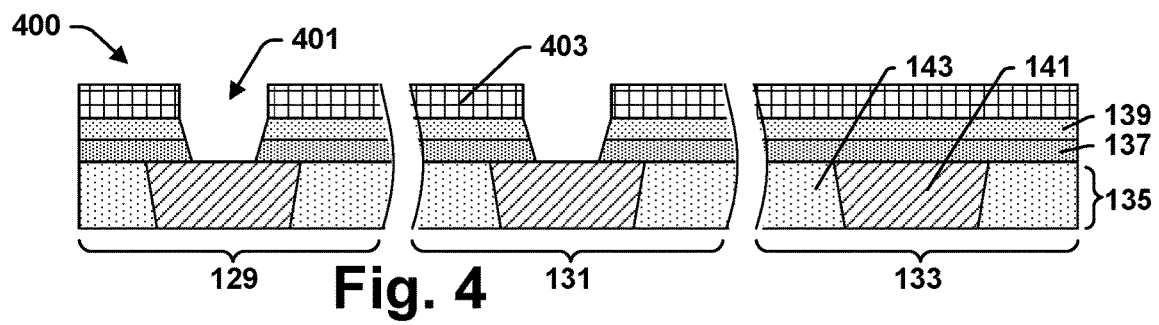
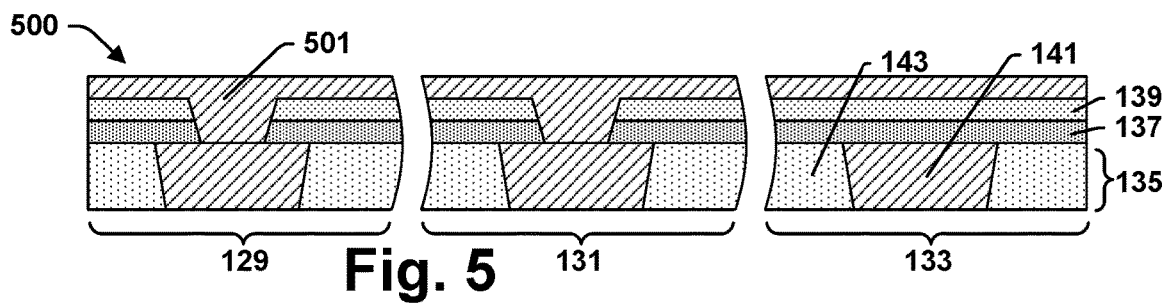
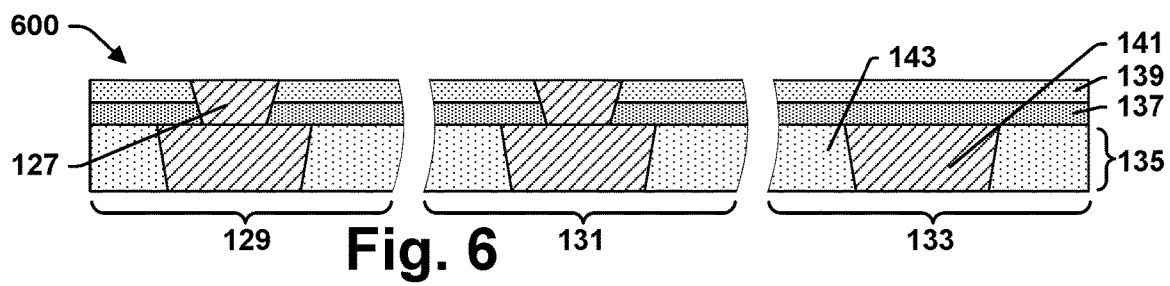
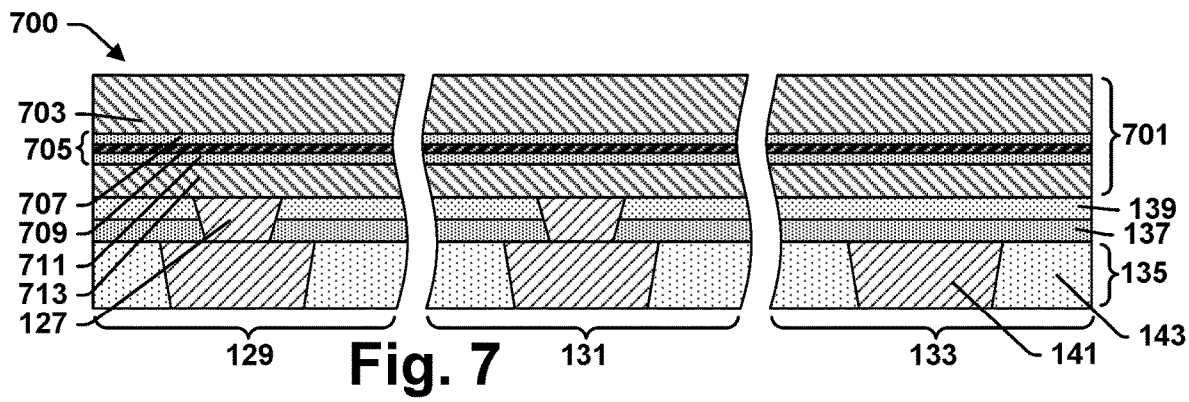

US 11,121,315 B2

STRUCTURE IMPROVING RELIABILITY OF TOP ELECTRODE CONTACT FOR RESISTANCE SWITCHING RAM HAVING CELLS OF VARYING HEIGHT

BACKGROUND

Resistance switching random access memory (resistance switching RAM) has a simple structure, low operating voltage, high-speed, good endurance, and complementary metal oxide semiconductor (CMOS) process compatibility. Resistance switching RAM is the most promising alternative to provide a downsized replacement for traditional flash memory. Resistance switching RAM is finding wide application in devices such as optical disks and non-volatile memory arrays.

A resistance switching RAM cell stores data within a layer of material that can be induced to undergo a phase change. The phase change can be induced within all or part of the layer to switch between a high resistance state and a low resistance state. The resistance state can be queried and interpreted as representing either a "0" or a "1". In a typical resistance switching RAM cell, the data storage layer includes an amorphous metal oxide. Upon application of a sufficient voltage, a metallic bridge is induced to form across the data storage layer, which results in the low resistance state. The metallic bridge can be disrupted and the high resistance state restored by applying a short high current density pulse that melts or otherwise breaks down all or part of the metallic structure. The data storage layer quickly cools and remains in the high resistance state until the low resistance state is induced again.

BRIEF DESCRIPTION OF THE DRAWINGS

Aspects of the present teachings are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-20 illustrate a series of cross-sectional views of an IC according to some aspects of the present teachings undergoing a manufacturing process according to some aspects of the present teachings.

DETAILED DESCRIPTION

Figure 1:
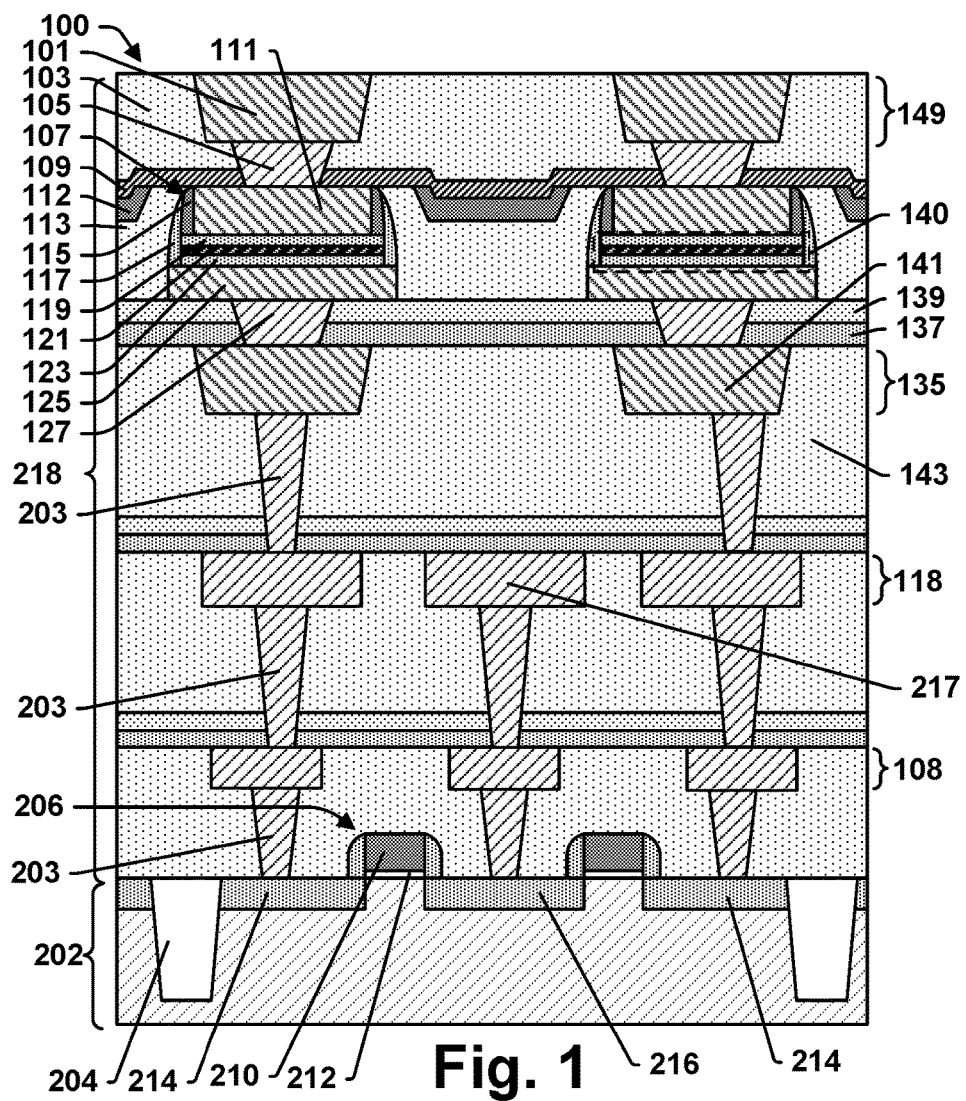
FIG. 1 illustrates a cross-sectional view of an integrated circuit (IC) with resistance switching RAM cells according to some aspects of the present teachings.

The present teachings provide many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

One of the challenges in manufacturing devices with resistance switching RAM is forming vias that land on the top electrodes of the resistance switching RAM cells. An etch stop layer may deposited over the resistance switching RAM cells and used when forming openings for the vias through the interlevel dielectric layer that covers the resistance switching RAM cells. The alignment of the openings to the resistance switching RAM cells is not perfect and the openings may extend over the edges of some resistance switching RAM cells. If the etch stop layer conforms to the shape of the resistance switching RAM cells, etching to expose the electrode at the top of the resistance switching RAM cells has the potential to etch through the sides of some resistance switching RAM cells and cause defects.

The challenge of creating via openings increases when resistance switching RAM cells are provided in varying sizes. When resistance switching RAM cells are provided in varying sizes, the resistance switching RAM cell heights may vary due to an etch loading effect. The variation in height can lead to a variation in thickness of dielectric over the resistance switching RAM cells.

According to the present teachings, the problem of forming top electrode vias that provide consistent results in devices that include resistance switching RAM cells of varying heights is solved using a dielectric composite that fills areas between resistance switching RAM cells and varies in height to align with the tops of both the taller and the shorter resistance switching RAM cells. An etch stop layer may be formed over the dielectric composite providing an equal thickness of etch-resistant dielectric over both taller and shorter resistance switching RAM cells. The dielectric composite causes the etch stop layer to extend laterally away from the resistance switching RAM cells to maintain separation between the via openings and the resistance switching RAM cell sides even when the openings are misaligned.

In some aspects of the present teachings, the dielectric composite includes a first dielectric layer and a second dielectric layer. The second dielectric layer does not abut the resistance switching RAM cells but is found in areas between resistance switching RAM cells spaced apart from the resistance switching RAM cells. The second dielectric layer is found along diagonals between cells in arrays of the resistance switching RAM cells. The second dielectric layer rests above the first dielectric layer and has an upper surface approximately in alignment with the tops of the shorter resistance switching RAM cells. This second dielectric layer may control a chemical mechanical polishing (CMP) process carried out before forming the etch stop layer. The CMP process may recess the dielectric composite sufficiently to expose the tops of both taller and shorter resistance switching RAM cells. The second dielectric layer may prevent the CMP process from causing dishing of the electrodes or recessing the dielectric composite excessively in areas adjacent the resistance switching RAM cells.

In a process according to the present teachings, after forming the resistance switching RAM cells, the first dielectric layer is formed conformally over the resistance switching RAM cells. The first dielectric layer may be produced by plasma enhanced atomic layer deposition or another process that allows precise control over the layer thickness. The second dielectric layer may then be deposited over the first dielectric layer. In some of these teachings, the total thickness of the first dielectric layer and the second dielectric layer is slightly less than the height of the smaller resistance switching RAM cells, but is less by an amount that is below the thickness of the top electrode of smaller resistance switching RAM cells. A spin on coating may be used to provide a planar upper surface and a non-selective etch back process used to thin the dielectric composite and make its upper surface more level. The etch back process may remove the second dielectric layer from areas above the resistance switching RAM cells. A CMP process may then be carried out to expose the top electrodes of both the smaller and the larger resistance switching RAM cells without significantly recessing sidewall spacers of the larger resistance switching RAM cells.

FIG. 1 illustrates a cross-sectional view of a portion of an integrated circuit device 100 including memory cells 107 according to some aspects of the present teachings. Each memory cell 107 include a bottom electrode 125, a metal tunneling junction (MTJ) 140, and a top electrode 111. MTJ 140 includes a first ferromagnet 123, an insulator 121, and a second ferromagnet 119. First sidewall spacers 115 are formed around resistance switching RAM cell 107 at the level of top electrode 111. Second spacers 117 are formed around resistance switching RAM cell 107 outside first sidewall spacers 115 and extend downward over the sides of MTJ 140. Resistance switching RAM cell 107 are surrounded by dielectric fill layer 113. A dielectric top layer 112 is formed over dielectric fill layer 113 in areas spaced laterally from resistance switching RAM cell 107. An etch stop layer 109 is disposed over dielectric top layer 112, dielectric fill layer 113, and top electrodes 111.

Top electrodes 111 are coupled to metal features 101 in metal interconnect 149 by top electrode vias 105, 151. Metal features 101 and top electrode vias 105, 151 are surrounded by interlevel dielectric layer 103. In some of these teachings, interlevel dielectric layer 103 is a low κ dielectric layer. In some of these teachings, interlevel dielectric layer 103 is an extremely low κ dielectric layer. Top electrode vias 105, 151 pass through dielectric layer 103 and etch stop layer 109 before landing on top electrodes 111. Bottom electrodes 125 are coupled to metal features 141 in metal interconnect layer 135 by a bottom electrode vias 127. Bottom electrode vias 127 are surrounded by etch stop layer 137 and interfacial layer 139. Metal feature 141 is surrounded by a matrix of interlevel dielectric 143.

Figure 2:
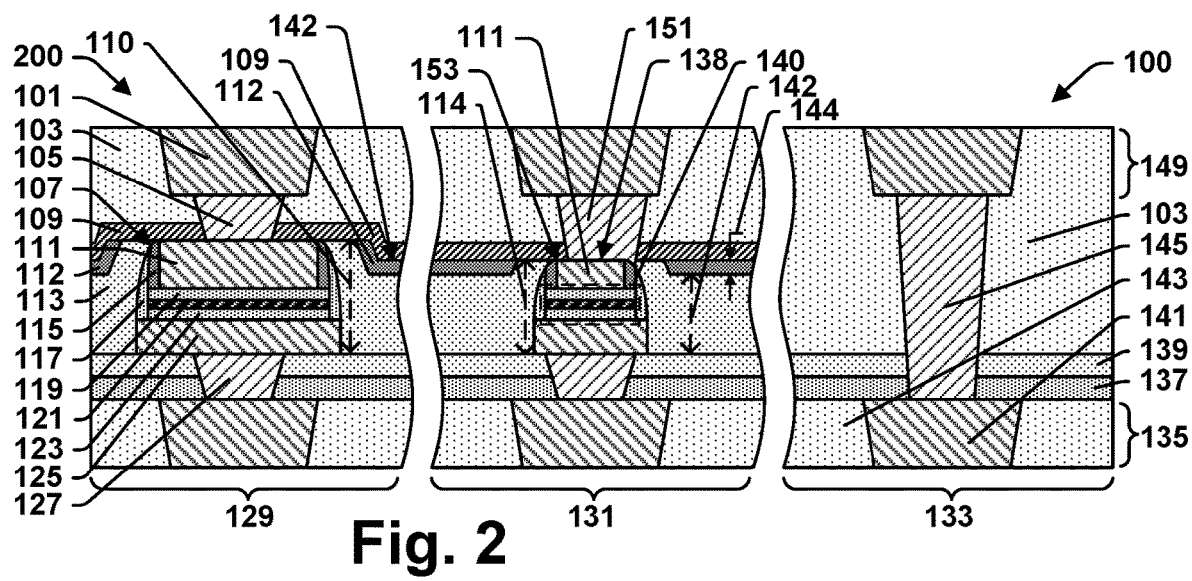
FIG. 2 illustrates another cross-sectional view of an integrated circuit (IC) with resistance switching RAM cells according to some aspects of the present teachings.

FIG. 2 illustrates a cross-sectional view 200 showing another portion of IC device 100. Cross-sectional view 200 focuses on an area from metal interconnect layer 135 to metal interconnect layer 149 and includes a portion of a first memory region 129 that includes resistance switching RAM cells 107, a portion of a second memory region 131 that includes resistance switching RAM cells 153, and a portion of a peripheral area 133. The illustrated resistance switching RAM cell 107 may be one in a first array of resistance switching RAM cells and the illustrated resistance switching RAM cell 153 may be one in a second array of resistance switching RAM cells. Resistance switching RAM cell 107 has a height 110 that is greater than a height 114 of resistance switching RAM cell 153.

The difference between height 114 and height 110 may be attributed to a difference in thickness between top electrode 111 of resistance switching RAM cell 107 and top electrode 111 of resistance switching RAM cell 153. The other layers of these resistance switching RAM cells 107, 153 may have equal thickness. Resistance switching RAM cells 107, 153 are aligned at their bottoms whereby the difference between height 114 and height 110 equals a difference in distance of the tops of resistance switching RAM cells 107 and resistance switching RAM cells 153 from substrate 202. In some of these teachings, the difference between height 114 and height 110 is of the same order of magnitude as a thickness of etch stop layer 109. In some of these teachings, the difference between height 114 and height 110 is one fourth or more the thickness of etch stop layer 109. In some of these teachings, the difference between height 114 and height 110 is one half or more the thickness of etch stop layer 109.

A thickness 142 of dielectric fill layer 113 combined with a thickness 144 of dielectric top layer 112 is slightly less than or equals to the height 114 of resistance switching RAM cell 153. As a result, an upper surface 142 of dielectric top layer 112 aligns approximately with an upper surface 138 of resistance switching RAM cell 153 except in the immediate vicinity of taller resistance switching RAM cells such as resistance switching RAM cell 107. Even around resistance switching RAM cell 107, dielectric top layer 112 drops to level off at a height where its upper surface 142 aligns approximately with the top of shorter resistance switching RAM cell 153.

Figure 21A:
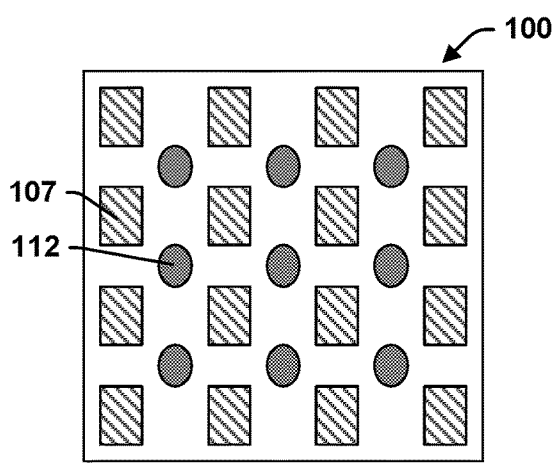
FIG. 21A illustrates a possible layout for an array of resistance switching RAM cells in a device according to the present teachings.
Figure 21B:
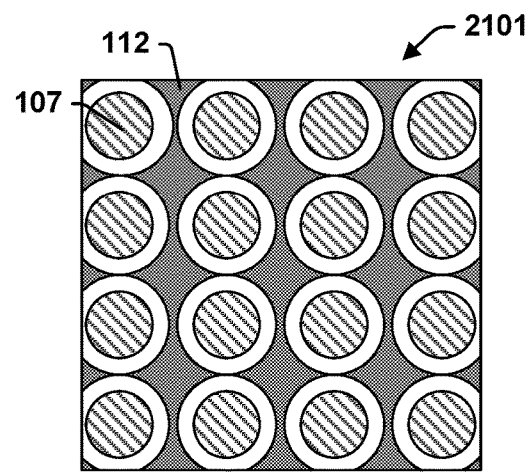
FIG. 21B illustrates another possible layout for an array of resistance switching RAM cells in a device according to the present teachings.

FIG. 21A illustrates a top view of an array of memory cells 107 in device 100. Memory cells 107 are shown as square-sided, but the edges may be rounded. Memory cells 107, 153 could equally be disc-shaped or have another shape consistent with the present teachings. As shown in FIG. 21A, in some embodiments, dielectric top layer 112 is spaced apart from memory cells 107 and forms islands along diagonals between cells in an array of memory cells 107. FIG. 21B provides an alternative layout 2101 for a case in which memory cells 107 are round. In the alternative layout 2101, dielectric top layer 112 is still spaced apart from memory cells 107 and in areas between memory cells 107 but due to differences in dimensions is not restricted to diagonals between memory cell in the array.

Referring again to FIG. 1, metal interconnect layer 135 and metal interconnect layer 149 are part of a metal interconnect structure 218 disposed over a substrate 202. Metal interconnect layer 135 may be the third metal interconnect layer over substrate 202 and metal interconnect layer 149 may be the fourth. Metal interconnect structure 218 also includes a first metal interconnect layer 108, a second metal interconnect layer 118, and may include additional interconnect layers above the ones that are shown. In some of these teachings, memory cells 107, 153 are located between the third metal interconnect layer 135 and the fourth metal interconnect layer 149 as shown in the illustrations. In some of these teachings, memory cells 107, 153 are located between a fourth metal interconnect layer 149 and a fifth metal interconnect layer. In general, memory cells 107, 153 may be located between any adjacent pair of metal interconnect layers.

Substrate 202 may be, for example, a bulk substrate (e.g., a bulk silicon substrate) or a silicon-on-insulator (SOI) substrate, or the like. One or more shallow trench isolation (STI) regions 204 or oxide-filled trenches may be disposed in or on substrate 202. A pair of word line transistors 206 may be located between STI regions 204. Word line transistors 206 may include gates 210 that are operative as word lines. Gates 210 are separated from substrate 202 by word line dielectric layers 212. Source/drain regions 214, 216 for word line transistors 206 may be formed in or on substrate 202. A metal feature 217 in second metal interconnect layer 118 or elsewhere in metal interconnect structure 218 may be coupled to source/drain region 216 and be operative as a source line. Bottom electrodes 125 may be coupled to source/drain regions 214 through vias 203. Metal feature 101 in fourth metal interconnect layer 149 or some other metal interconnect layer above memory cells 107 may be operative as bit lines. The illustrated control structure for memory cells 107, 153 in IC device 100 is one of many possible control structures that may be used to connect and operate memory cells 107, 153. IC devices according to the present teachings are not limited in terms of control structure.

Metal interconnect structure 218 is the product of back-end-of-line (BEOL) processing. Metal features 101, 141, 217 of metal interconnect layers 108, 118, 135, 149 and vias 105, 127, 151, 203 may be formed of metals such as copper, aluminum, gold, tungsten, titanium nitride, and the like. Interlevel dielectric layers 103, 143 may be low κ dielectrics or extremely low κ dielectrics. A low-k dielectric is a material having a smaller dielectric constant than $SiO_2$. $SiO_2$ has a dielectric constant of about 3.9. Examples of low-k dielectrics include organosilicate glasses (OSG) such as carbon-doped silicon dioxide, fluorine-doped silicon dioxide (otherwise referred to as fluorinated silica glass (FSG), organic polymer low-k dielectrics, and porous silicate glass. An extremely low-k dielectric is a material having a dielectric constant of about 2.1 or less. An extremely low-k dielectric material is generally a low-k dielectric material formed into a porous structure. Porosity reduces the effective dielectric constant.

Each of the layers in memory cells 107, 153 may include a plurality of layers having various compositions. Bottom electrode via 127 may be titanium nitride or the like or another suitable conductive material. In some examples, the thickness of bottom electrode via 127 is in the range from about 250 Å to about 500 Å. A diffusion barrier layer may separate bottom electrode via 127 from metal feature 141. A barrier lay could be, for example tantalum nitride or the like. In some examples, the thickness of the barrier layer is the range from about 50 Å to about 100 Å.

Bottom electrode 125 is a conductive material such as tantalum, titanium, platinum, gold, iridium, tungsten, nickel, ruthenium, copper, titanium nitride, tantalum nitride, tungsten silicide, a combination thereof, or the like. In some of these teachings, the thickness of bottom electrode 125 is in the range from about 20 Å to about 200 Å. In some of these teachings, the thickness of bottom electrode 125 is in the range from about 50 Å to about 150 Å. These exemplary thicknesses, along with other example dimensions given herein are for a certain fabrication node. The exemplary dimensions may be scaled proportionally for other fabrication nodes.

First ferromagnet 123 and second ferromagnet 119 of MTJ 140 are materials with ferromagnetism. Materials with ferromagnetism include cobalt-iron-boron (CxFeB), cobalt-iron (CoFe), and nickel-iron (NiFe), cobalt (Co), iron (Fe), nickel (Ni), iron-boron (FeB), iron-platinum (FePt), and the like. The first ferromagnet 123 and the second ferromagnet 119 may be different materials. In some embodiments, both first ferromagnet 123 and second ferromagnet 119 are $Co_xFe_yB_z$ although the atomic ratios (x, y z) may differ between the first ferromagnet 123 and the second ferromagnet 119. First ferromagnet 123 and second ferromagnet 119 may be formed by any suitable process. Examples of suitable processes may include electroplating, electroless plating, sputtering, chemical vapor deposition (CVD), or another applicable process or the like.

Insulator 121 is a dielectric layer. Examples of materials that may be suitable for insulator 121 include magnesium oxide (MgO), aluminum oxides ($Al_xO_y$), titanium oxides ($TiO_x$), and the like. In some embodiments, insulator 121 is magnesium oxide. Insulator 121 may be formed by any suitable process. A suitable process may be chemical vapor deposition (CVD), physical vapor deposition (PVD), atomic layer deposition (ALD), spin-on coating, or the like.

Top electrode 111 is disposed over MTJ 140. Top electrode 111 may include a liner of tungsten or the like. Top electrode 111 may comprise one or more layers of metal or metal compounds such as titanium, titanium nitride, tantalum, tantalum nitride, or the like. In some of these teachings, the thickness of top electrode 111 in larger resistance switching RAM cells 107 is in the range from about 100 Å to about 500 Å. In some of these teachings, the thickness of top electrode 111 in larger resistance switching RAM cells 107 is in the range from about 200 Å to about 400 Å.

In some of these teachings, the thickness of top electrode 111 in smaller resistance switching RAM cells 153 is from about 40 Å to about 150 Å less than its thickness in larger resistance switching RAM cells 107. In some of these teachings, the thickness of top electrode 111 in smaller resistance switching RAM cells 153 is from about 60 Å to about 120 Å less than its thickness in larger resistance switching RAM cells 107. In some of these teachings, the thickness of top electrode 111 in smaller resistance switching RAM cells 153 is 90% or less its thickness in larger resistance switching RAM cells 107. In some of these teachings, the thickness of top electrode 111 in smaller resistance switching RAM cells 153 is 80% or less its thickness in larger resistance switching RAM cells 107.

During operation of memory cells 107, 153 voltages are applied between top electrode 111 and bottom electrode 125. Depending on the voltages applied, the voltages may be used to assess whether memory cell 107 is in a low resistance state or a high resistance state or to place memory cells 107, 153 in a high resistance state or a low resistance state.

MTJ 140 is one type of resistance switching structure associated with one type or resistance switching random access memory. Memory cells 107, 153 may be any type of resistance switching random access memory. Examples of resistance switching random access memory include, without limitation, oxygen displacement memory (OxRAM), conductive bridging random access memory (CBRAM), magnetoresistive random access memory (MRAM), ferroelectric random access memory (FRAM), phase-change memory (PCM), carbon nanotube random access memory (NRAM), and the like. Various layers of various thicknesses and compositions may replace MTJ 140 in memory cells 107, 153 to provide resistance switching structures associated with these various types of resistance switching random access memory. For example, instead of MTJ 140, memory cells 107, 153 may include an amorphous oxide layer that reversibly forms conductive bridges and may further include an active metal layer that alternate donates and receives ions from the amorphous oxide layer.

FIGS. 3-20 provide a series of cross-sectional views 300-2000 that illustrate an integrated circuit device according to the present teachings at various stages of manufacture according to a process of the present teachings. Although FIGS. 3-20 are described in relation to a series of acts, it will be appreciated that the order of the acts may in some cases be altered and that this series of acts is applicable to structures other than the ones illustrated. In some embodiments, some of these acts may be omitted in whole or in part. Furthermore, it will be appreciated that the structures shown in FIGS. 3-20 are not limited to a method of manufacture but rather may stand alone as structures separate from the method.

As illustrated by the cross-sectional view 300 of FIG. 3, an etch stop layer 137 and interfacial layer 139 are formed over third metal interconnect 135. Third metal interconnect 135 may be formed by any suitable process. Examples of suitable processes include damascene and dual damascene processes. Etch stop layer 137 may be, for example, and silicon carbide (SiC) or the like. Interfacial layer 139 may be, for example, silicon dioxide (SiO$_2$) or the like. These layers may also be or include other dielectrics such as silicon nitride (Si$_3$N$_4$), silicon oxynitride (SiON), silicon oxycarbide (SiOC), or the like. The combined thickness of etch stop layer 137 and interfacial layer 139 may be in the range from 150 to 600 Å. In some embodiments, the combined thickness of etch stop layer 137 and interfacial layer 139 is in the range from 250 to 500 Å. In some embodiments, the combined thickness of etch stop layer 137 and interfacial layer 139 is less than 400 Å, for example, 300 Å. Etch stop layer 137 and interfacial layer 139 may be formed by any suitable process or combination of processes.

As illustrated by the cross-sectional view 400 of FIG. 4, a mask 403 may be formed over etch stop layer 137 and interfacial layer 139 and used to form openings 401 through etch stop layer 137 and interfacial layer 139. Openings 401 are positioned over metal features 141 of metal interconnect 135. Mask 403 may be a photoresist mask patterned using photolithography. Openings 401 may be formed using any suitable etch process, for example, plasma etching.

As illustrated by the cross-sectional view 500 of FIG. 5, mask 403 may be stripped and a layer of conductive material 501 deposited to fill openings 401. As illustrated by the cross-sectional view 600 of FIG. 6, the layer of conductive material 501 may be planarized to form vias 127. As previously noted, a diffusion barrier layer may be deposited before the bulk of the layer of material 501. The layer of conductive material 501 may be formed by any suitable growth or deposition process. The planarization process may be chemical mechanical polishing (CMP) or any other suitable planarization process.

As illustrated by the cross-sectional view 700 of FIG. 7 a resistance switching RAM cell stack 701 may be formed over the surface of the structure illustrated by cross-sectional view 600 of FIG. 6. In this example, resistance switching RAM cell stack 701 includes bottom electrode layer 713, MTJ layer 705, and top electrode layer 703. MTJ layer 705 includes a first ferromagnetic layer 711, an insulating layer 709, and a second ferromagnetic layer 707. Bottom electrode layer 713, the various layers of MTJ layer 705, and top electrode 111 may be formed by any suitable process or combination of processes. In some of these teachings, the thickness of resistance switching RAM cell stack 701 is in the range from about 300 to about 1000 Å. In some of these teachings, the thickness of resistance switching RAM cell stack 701 is in the range from about 500 to about 800 Å.

Figure 8:
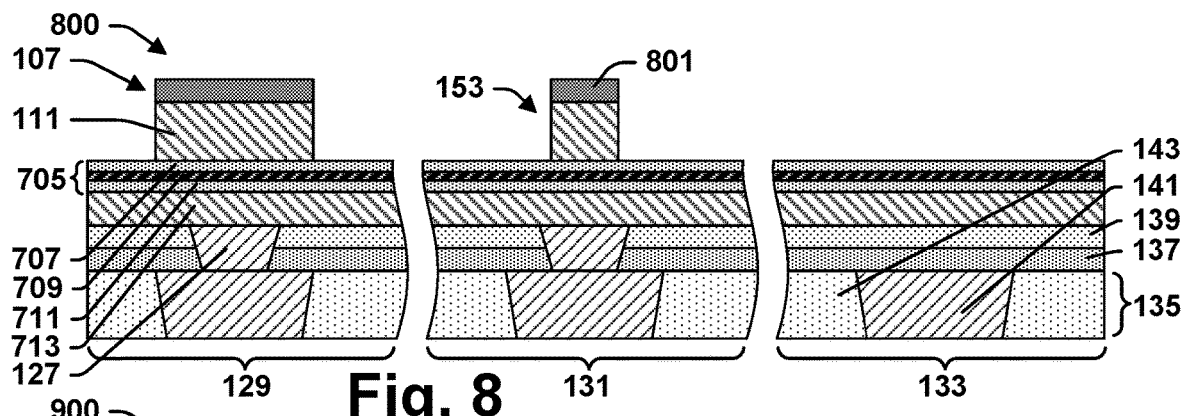

As illustrated by the cross-sectional view 800 of FIG. 8, a mask 801 may be formed over resistance switching RAM cell stack 701 and used to pattern top electrode layer 703 to define top electrodes 111 for resistance switching RAM cells 107, 153. Patterning may use any suitable etch process, for example, plasma etching or the like. In some embodiments, MTJ layer 705 or another resistance switching structure is used as an etch stop for this process.

Figure 9:
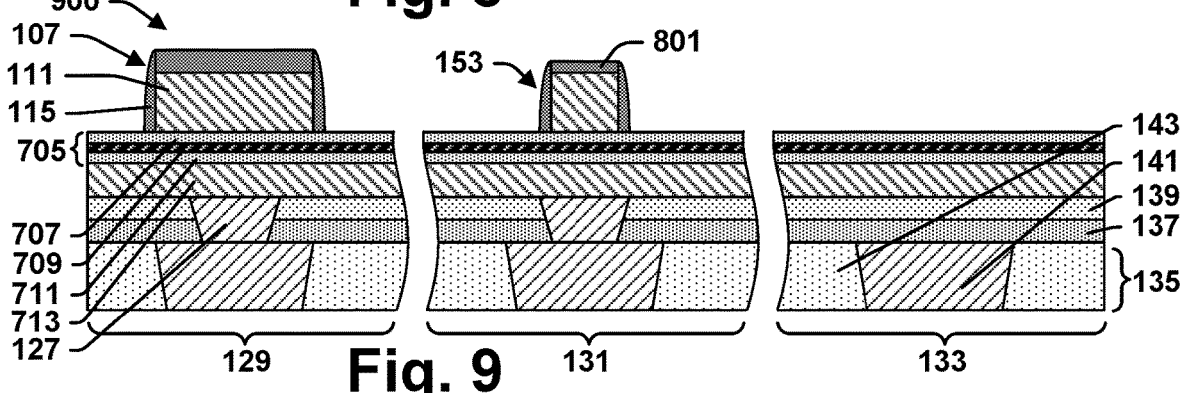

As illustrated by the cross-sectional view 900 of FIG. 9, first sidewall spacers 115 may be formed adjacent top electrodes 111. Forming first sidewall spacers 115 may include depositing spacer material and etching. The spacer material may be one or more layers of any suitable dielectric material or materials. Materials that may be suitable for first sidewall spacers 115 include, without limitation, silicon oxide, silicon nitride, silicon oxynitride, and the like. The material may be deposited by any suitable processes or processes. A suitable process may be chemical vapor deposition (CVD), physical vapor deposition (PVD), atomic layer deposition (ALD), or the like. The etch process may include plasma etching or any other suitable etch process(es) that selectively removes the spacer material where it is thinnest with respect to the vertical.

The etch that forms sidewall spacers 115 may thin hard mask 801 over resistance switching RAM cells 107, 153. As shown by the cross-sectional view 900 of FIG. 9, the thinning may be greater for hard mask 801 over smaller resistance switching RAM cells 153 than for hard mask 801 over larger resistance switching RAM cells 107. One cause for different extents of thinning may be the "etch loading effect." The etch loading effect may occur at a stage of processing during which there is more material around larger resistance switching RAM cells 107 that reacts with etchants than around smaller resistance switching RAM cells 153. The greater amount of reactive material causes a more rapid consumption of etchants leading to a reduced concentration of etchants around resistance switching RAM cells 107.

Figure 10:
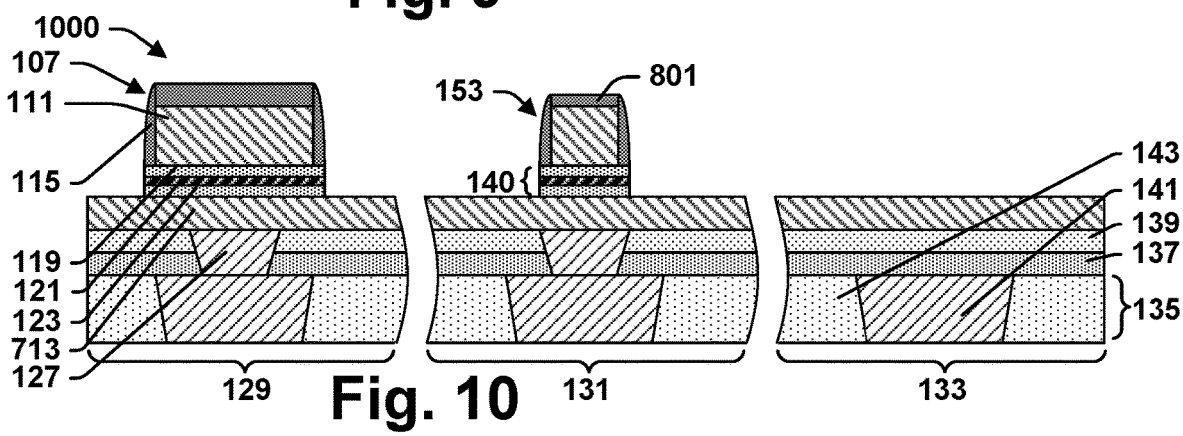

As illustrated by the cross-sectional view 1000 of FIG. 10, an etch may be carried out using hard masks 801 and first sidewall spacers 115 as masks to pattern MTJ layer 705 to define MTJs 140 for resistance switching RAM cells 107, 153. The etch process may be a plasma etch. Bottom electrode layer 713 may provide an etch stop for this etch process. During this etch process, hard mask 801 may be further thinned and an etch loading effect may make this thinning greater for hard mask 801 over resistance switching RAM cells 153 as compared to hard mask 801 over resistance switching RAM cells 107.

Figure 11:
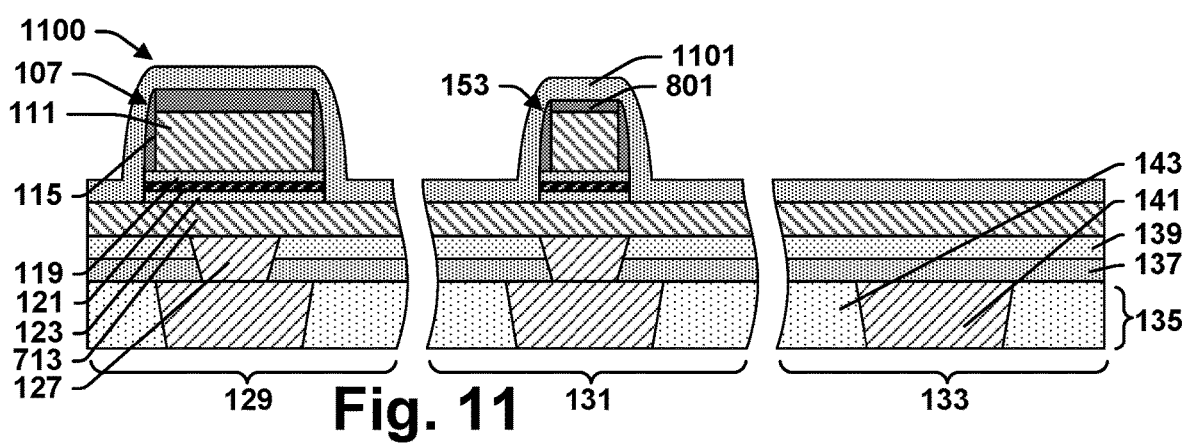

As illustrated by the cross-sectional view 1100 of FIG. 11, a second spacer layer 1101 may be deposited over the structure illustrated by the cross-sectional view 1000 of FIG. 10. The second spacer layer 1101 may be one or more layers of any suitable dielectric material or materials. Materials that may be suitable for second spacer layer 1101 include, without limitation, silicon oxide (SiO$_2$), silicon nitride (SiN), silicon oxynitride (SiON), and the like. The material may be deposited by any suitable processes or processes. A suitable process may be chemical vapor deposition (CVD), physical vapor deposition (PVD), atomic layer deposition (ALD), or the like. Second spacer layer 1101 may be the same material as first sidewall spacers 115 or a different material. In some embodiments, second spacer layer 1101 is silicon oxynitride (SiON) and first sidewall spacers 115 are silicon nitride (SiN).

Figure 12:
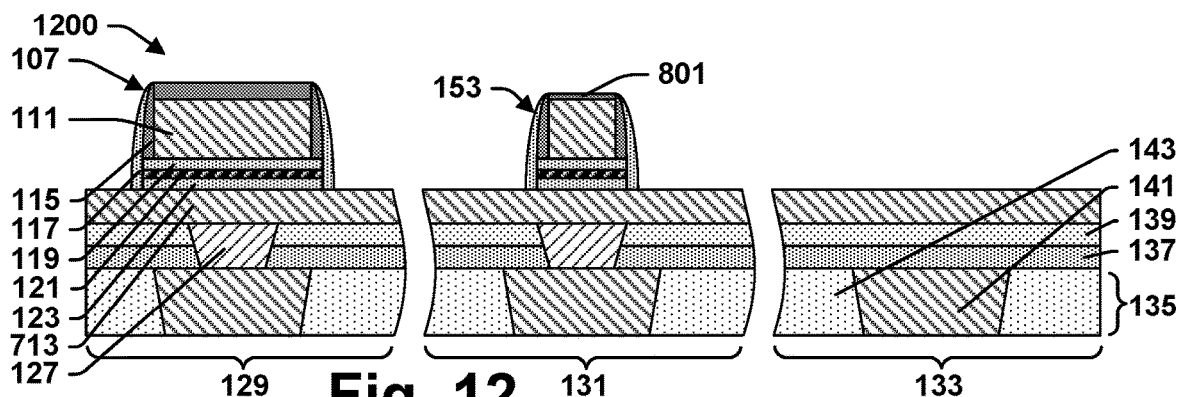

As illustrated by the cross-sectional view 1200 of FIG. 12, second spacer layer 1101 is etched to form second sidewall spacers 117. The etch process may include plasma etching or any other suitable etch process(es) that selectively removes the spacer material where it is thinnest in the up and down direction. This etch process may also thin hard mask 801 over resistance switching RAM cells 153 to a greater degree than hard mask 801 over resistance switching RAM cells 107

Figure 13:
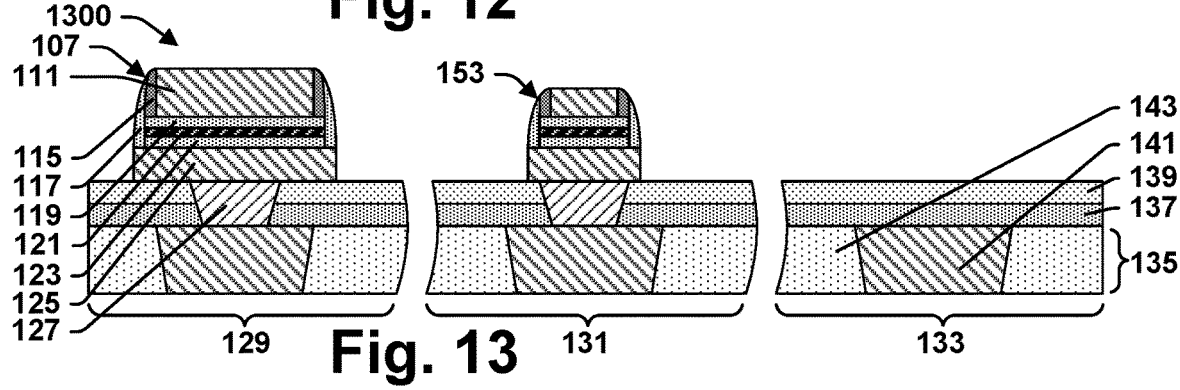

As illustrated by the cross-sectional view 1300 of FIG. 13, an etch may be carried out to pattern bottom electrode layer 713 to define bottom electrodes 125 for resistance switching RAM cells 107, 153. At the beginning of this process, hard masks 801, first sidewall spacers 115, and second sidewall spacers 117 are operative as a mask. The etch process may be a plasma etch. In some of these teachings, over the course of this etch process, hard masks 801 are completely removed to expose top electrodes 111. Top electrodes 111 may be the same or a similar material to bottom electrode layer 713. Accordingly, once hard masks 801 are removed, the etch may begin to thin top electrodes 111. To the extent that hard mask 801 is thinner over resistance switching RAM cells 153 than over resistance switching RAM cells 107, the etching of top electrodes 111 of resistance switching RAM cells 153 will begin earlier and progress further than the etching of top electrodes 111 of resistance switching RAM cells 107. This may cause a small difference in thickness between hard masks 801 over resistance switching RAM cells 107 and hard masks 801 over resistance switching RAM cells 153 to lead to a relatively larger difference in thickness between top electrodes 111 of resistance switching RAM cells 107 and those of resistance switching RAM cells 153.

Figure 14:
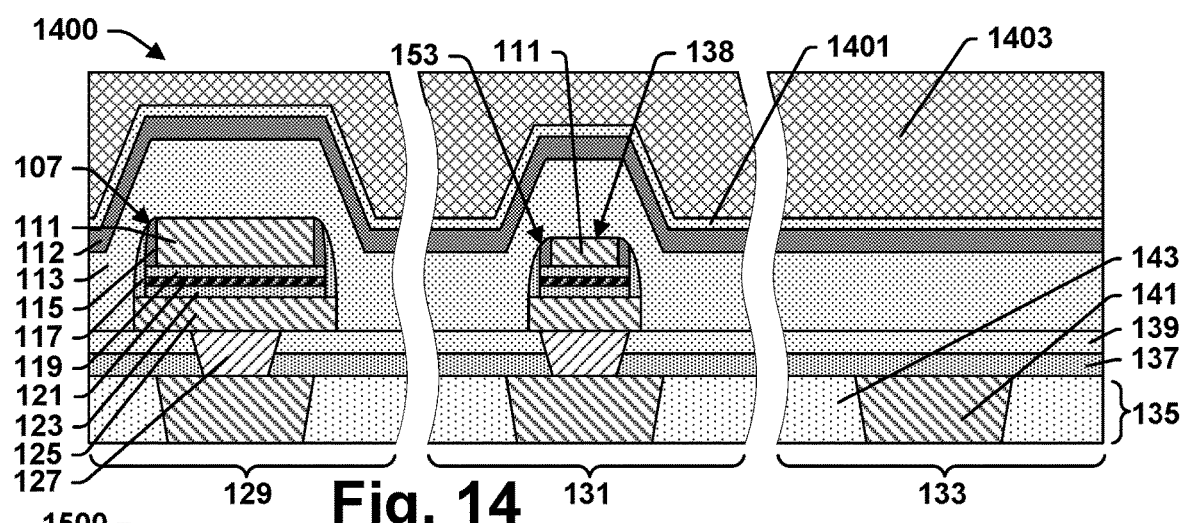

As illustrated by the cross-sectional view 1400 of FIG. 14, a plurality of layers of various materials may be formed over the structure illustrated by the cross-sectional view 1300 of FIG. 13. These layers may include dielectric fill layer 113, dielectric top layer 112, oxide layer 1401, and bottom anti-reflective coating (BARC) 1403. Dielectric fill layer 113 may be a dielectric such as silicon dioxide ($SiO_2$) or the like. Dielectric top layer 112 may be a dielectric with a distinct composition from dielectric top layer 112. Dielectric top layer 112 may be, for example, silicon oxynitride (SiON), silicon nitride (SiN), silicon cyanide (SINC), silicon oxycarbide (SiOC), or the like. In some of these teachings, dielectric top layer 112 is silicon oxynitride (SiON). Oxide layer 1401 is an optional layer that may be, for example, silicon dioxide ($SiO_2$) or the like.

In some of these teachings, dielectric fill layer 113 and dielectric top layer 112 are deposited to thicknesses whereby an upper surface 138 of top electrodes 111 of smaller resistance switching RAM cells 153 aligns with (is at the height of) dielectric top layer 112 in peripheral area 133. The alignment may be with a middle of dielectric top layer 112 or the top of dielectric top layer 112. On the other hand, the top surface 142 of dielectric top layer 112 in peripheral area 133 may be below the height of top surface 136 of larger resistance switching RAM cells 107.

In some of these teachings, the thickness of dielectric fill layer 113 is in the range from about 200 Å to about 1000 Å. In some of these teachings, the thickness of dielectric fill layer 113 is in the range from about 300 Å to about 600 Å. In some of these teachings, the thickness of dielectric top layer 112 is in the range from about 50 Å to about 400 Å. In some of these teachings, the thickness of dielectric top layer 112 is in the range from about 60 Å to about 250 Å. In some of these teachings, the thickness of dielectric top layer 112 is in the range from about 100 Å to about 200 Å.

Dielectric fill layer 113 and dielectric top layer 112 may be deposited by any suitable process or combination of processes. In some of these teachings, dielectric fill layer 113 and dielectric top layer 112 are formed by an atomic layer deposition (ALD) processes such as plasma-enhanced atomic layer deposition (PEALD). ALD allows precise control of layer thicknesses. Oxide layer 1401 may also be formed by ALD. BARC 1403 may be an organic material applied by a spin-on process to form a planar upper surface.

Figure 15:
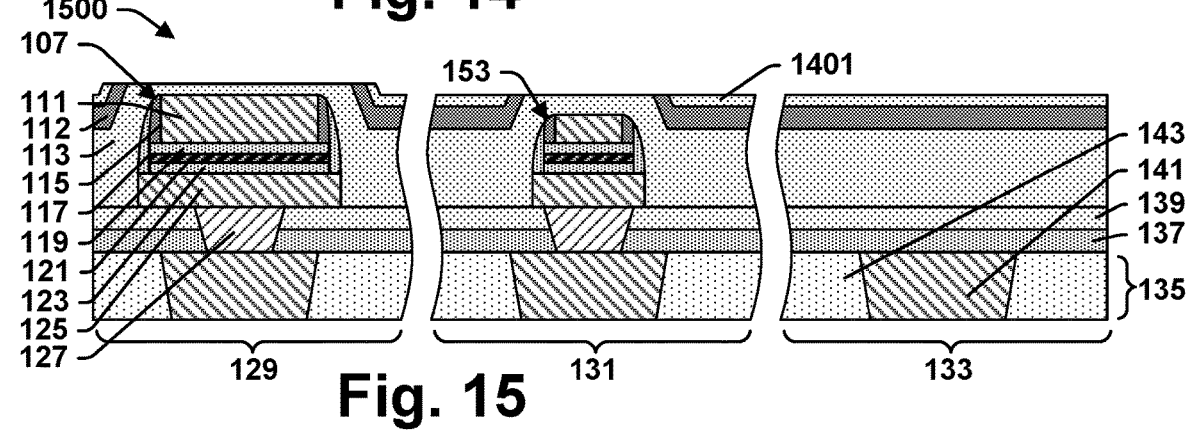

As illustrated by the cross-sectional view 1500 of FIG. 15, a non-selective etch back process may be used to recess the surface of the structure illustrated by the cross-sectional view 1400 of FIG. 14. This etch back process may remove most or all of BARC 1403. Oxide layer 1401 may facilitate determining an endpoint for this etch back process.

Figure 16:
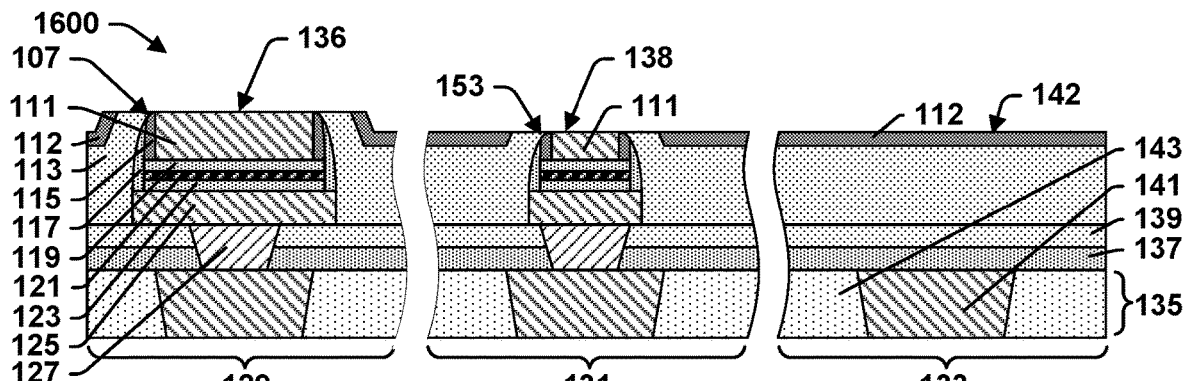

As illustrated by the cross-sectional view 1600 of FIG. 16, a chemical mechanical polishing (CMP) may be used to expose top electrode 111 for both smaller resistance switching RAM cells 153 and larger resistance switching RAM cells 107. The CMP process may stop on dielectric top layer 112 in areas away from resistance switching RAM cells 107,153 such as peripheral area 133. In some of these teachings, the CMP process uses a slurry that provides a much higher etch rate for dielectric top layer 112 and dielectric fill layer 113 than for top electrodes 111, whereby the CMP process has little effect on the thickness of top electrodes 111.

Because top electrodes 111 do not recesses significantly, first sidewall spacers 115 and second sidewall spacers 117 are not significantly affected by the CMP process. Top electrodes 111 of larger resistance switching RAM cells 107 remain thicker than top electrodes 111 of smaller resistance switching RAM cells 153. The CMP process may recess dielectric top layer 112 until an upper surface 142 dielectric top layer 112 in areas distal from larger resistance switching RAM cells 107 is at or below upper surface 138 of resistance switching RAM cells 153. In some of these teachings, CMP leaves upper surface 142 at approximately the same height at upper surface 138. The portion of dielectric top layer 112 remaining after the CMP process is spaced apart from resistance switching RAM cells 107, 153.

In some of these teaching, the CMP process has a selectivity for removing $SiO_2$ that is 100 or more times its selectivity for removing the metal of top electrodes 111. In some of these teaching, the CMP process has a selectivity for removing SiON or other material forming dielectric top layer 112 that is ten or more times its selectivity for removing the metal of top electrodes 111. In some of these teachings, the desired selectivity is provided by carrying out CMP with a slurry that include ceria. In some of these teachings, the is free of silica.

Figure 17:
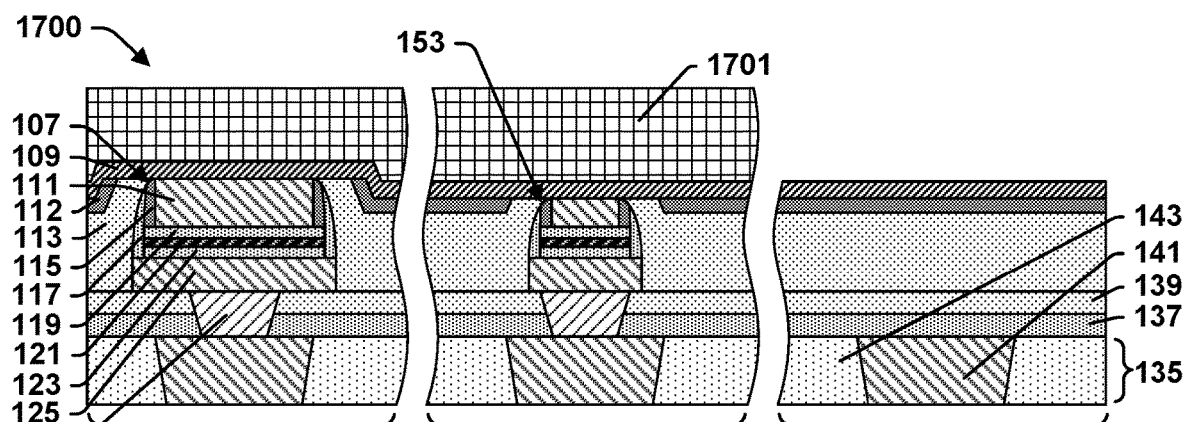

As illustrated by the cross-sectional view 1700 of FIG. 17, etch stop layer 109 may be formed over the structure illustrated by cross-sectional view 1600 of FIG. 16. Etch stop layer 109 may be any suitable dielectric. Examples of dielectrics that may be suitable for etch stop layer 109 include silicon nitride (SiN), silicon oxynitride (SiON), silicon oxycarbide (SiOC), and the like. In some of these teachings, etch stop layer 109 is silicon nitride (SiN). Etch stop layer 109 may be formed by any suitable processes or processes. A suitable process may be chemical vapor deposition (CVD), physical vapor deposition (PVD), atomic layer deposition (ALD), or the like.

As shown by cross-sectional view 1700, etch stop layer 109 may be in direct contact with top electrode 111 of both smaller resistance switching RAM cells 153 and larger resistance switching RAM cells 107. Etch stop layer 109 may have equal thickness over smaller resistance switching RAM cells 153 and larger resistance switching RAM cells 107. Dielectric fill layer 113 separates etch stop layer 109 from second sidewall spacer 117 except possibly in small areas very near the tops of resistance switching RAM cells 107, 153. Dielectric fill layer 113 causes etch stop layer 109 to extend outwardly from both smaller resistance switching RAM cells 153 and larger resistance switching RAM cells 107 and outwardly from first sidewall spacers 115 and second sidewall spacers 117 rather than curve downwardly in conformation with the shapes of resistance switching RAM cells 107, 153 with their associated first sidewall spacers 115 and second sidewall spacers 117. In some of these teachings, etch stop layer 109 gradually slopes downward as it extends away from larger resistance switching RAM cells 107 and levels off at a height near that of smaller resistance switching RAM cells 153. In some of these teachings, etch stop layer 109 levels off at a height above MTJs 140.

As further illustrated by the cross-sectional view 1700 of FIG. 17, a photoresist 1701 may be formed over etch stop layer 109 in first memory region 129 and second memory region 131. As illustrated by the cross-sectional view 1800 of FIG. 18, photoresist 1701 may be used to remove etch stop layer 109 from peripheral area 133. Subsequently, using photoresist 1701 and/or etch stop layer 109 as masks, dielectric top layer 112 and dielectric fill layer 113 may also be etched from peripheral area 133. Photoresist 1701 may be stripped during or after this etching.

Figure 18:
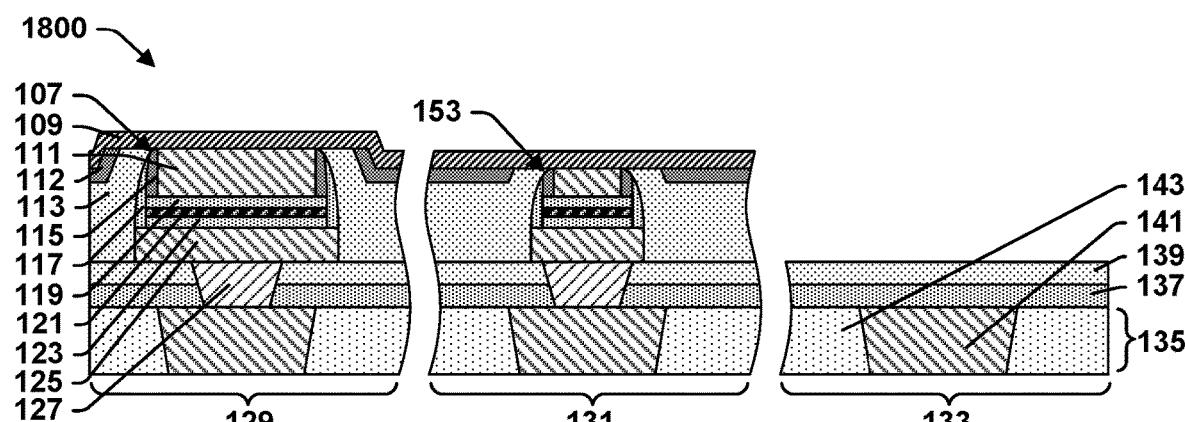
Figure 19:
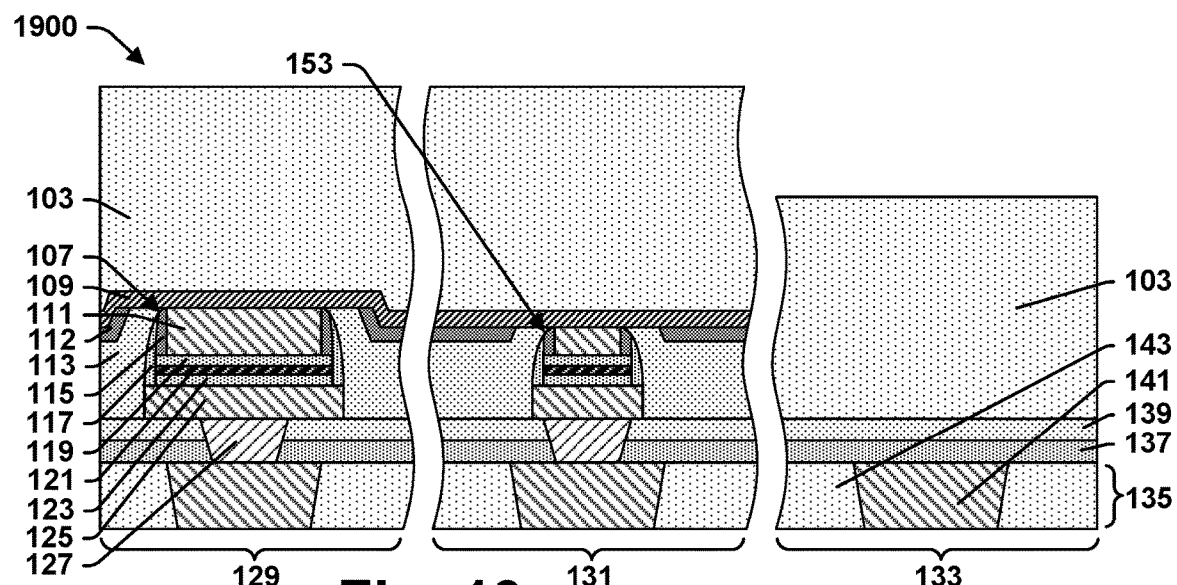

As illustrated by the cross-sectional view 1900 of FIG. 19, interlevel dielectric layer 103 may be formed over the structure illustrated by the cross-sectional view 1800 of FIG. 18. Interlevel dielectric 103 may be a low-κ or extremely low-κ dielectric formed by any suitable process. In some of these teachings, etch stop layer 109 is the only layer separating top electrodes 111 from interlevel dielectric 103. In some of these teachings, immediately after deposition interlevel dielectric layer 103 has a difference in height between first memory region 129 and peripheral area 133 that is in the range from about 100 Å to about 900 Å. In some of these teachings, interlevel dielectric layer 103 has a difference in height between first memory region 129 and peripheral area 133 that is in the range from about 500 Å to about 750 Å.

Figure 20:
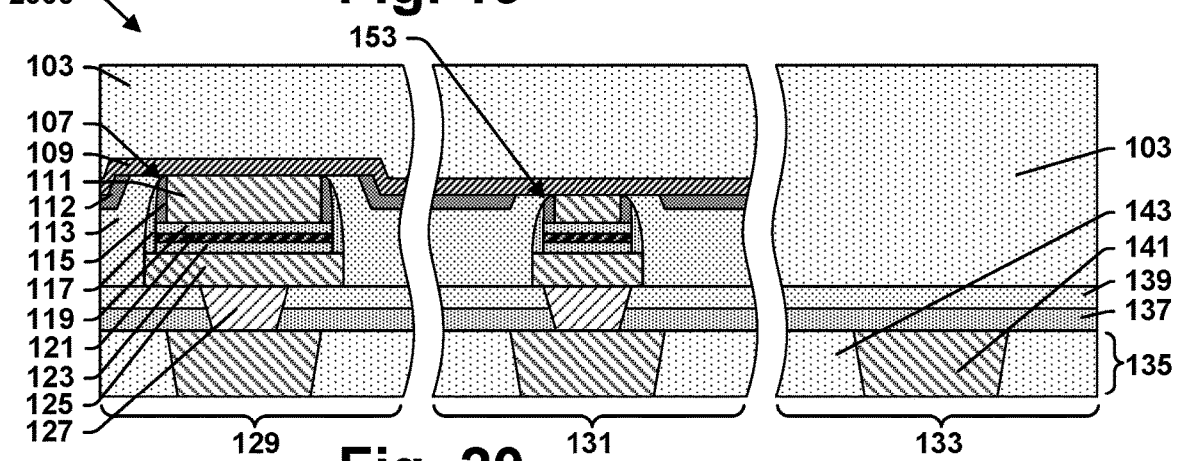

As illustrated by the cross-sectional view 2000 of FIG. 20, the surface of interlevel dielectric layer 103 may be planarized. Planarization may include a combination of processes. A combination of process may include a masked etch to remove most of the excess interlevel dielectric layer 103 from first memory region 129 and second memory region 131 followed by buffing to produces a level surface. In some of these teachings, planarization is accomplished by buffing alone.

Figure 22:
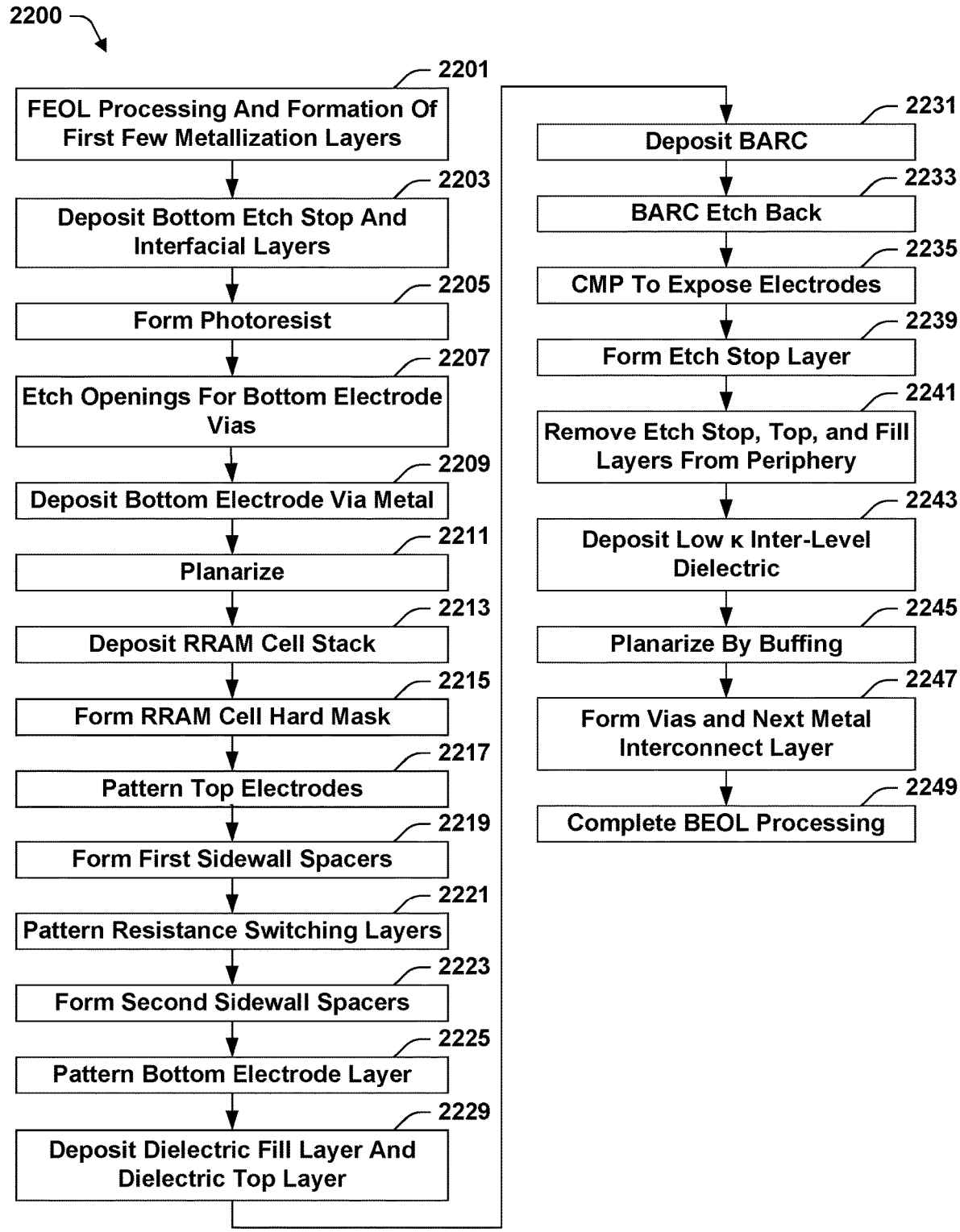
FIG. 22 present a flow chart of a manufacturing process according to some aspects of the present teachings.

FIG. 22 provides a flow chart of a process 2200 according to some aspects of the present teachings. Process 2200 may be used to produce integrated circuit devices according to the present teachings. While process 2200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Process 2200 begins with act 2201, front-end-of-line (FEOL) processing and formation of a first few metal interconnect layers 108, 118, 135 and act 2203, depositing etch stop layer 137 and interfacial layer 139 to produce a structure such as the one illustrated by cross-sectional view 300 of FIG. 3.

Process 2200 continues with act 2205, forming and patterning a mask 403 and act 2207, etching to form openings 401 in etch stop layer 137 and interfacial layer 139 as illustrated by cross-sectional view 400 of FIG. 4. Act 2209 is depositing a layer of material 501 to fill openings 401 as illustrated by cross-sectional view 500 of FIG. 5. Act 2211 is planarizing to remove the layer of material 501 that lies outside openings 401, thereby forming vias 127 as illustrated by cross-sectional view 600 of FIG. 6. Material 501 and other metal layers may be formed by any suitable process. Suitable processes may include electroplating, electroless plating, sputtering, chemical vapor deposition (CVD), or the like.

Act 2213 is forming resistance switching RAM cell stack 701 as illustrated by the cross-sectional view 700 of FIG. 7. Resistance switching RAM call stack 701 may include a bottom electrode layer 711, a resistance switching layer 705, and a top electrode layer 703. Resistance switching layer 705 may be a metal tunneling junction layer. A metal tunneling junction layer may include first ferromagnetic layer 713, insulator layer 711, and second ferromagnetic layer 709.

Act 2215 is forming resistance switching RAM cell hard mask 801. Act 2217 is using resistance switching RAM cell hard mask 801 to pattern top electrodes 111 from top electrode layer 703 as shown in FIG. 8.

Act 2219 is forming first sidewall spacers 115 adjacent top electrodes 111 as shown in FIG. 9. This may include depositing a layer of spacer material then etching to leave a remaining portion of the spacer material to form first sidewall spacers 115.

Act 2221 is etching resistance switching layer 705 to form resistance switching structures such as MTJs 140 as shown in FIG. 10. Resistance switching RAM cell hard mask 801 and first sidewall spacers 115 may define the pattern of this etch.

Act 2223 is forming second sidewall spacers 117. This may include depositing a layer of spacer material 1101 as shown in FIG. 11 followed by a spacer etch to form second sidewall spacers 117 as shown in FIG. 12.

Act 2225 is etching to pattern bottom electrodes 125 from bottom electrode layer 713 as shown in FIG. 13. In some of these teachings, this etch also removes the remainder of resistance switching RAM cell hard mask 801 and exposes top electrodes 111. One or more of the etches of acts 2217, 2219, 2221, and 2223 may have thinned hard mask 801 over smaller resistance switching RAM cells 153 to a greater extent than over larger resistance switching RAM cells 107. As a result, act 2225 may leave smaller resistance switching RAM cells 153 shorter than larger resistance switching RAM cells 107.

Act 2229 is depositing dielectric fill layer 112 and dielectric top layer 113 over resistance switching RAM cells 107, 153 as shown in FIG. 14. Act 2231 is depositing BARC 1403 to form a planar surface as also shown in FIG. 14. Act 2233 is a non-selective etch back process that recesses the surface as shown in FIG. 15. The non-selective etch back process of act 2233 may remove various material from the top of the device while leaving the surface nearly planar.

Act 2235 is a CMP process with low selectivity for top electrodes 111. Act 2235 re-exposes top electrodes 111 for both larger resistance switching RAM cells 107 and smaller resistance switching RAM cells 153 as shown in FIG. 16. Act 2235 does not substantially shorten either larger resistance switching RAM cells 107 or smaller resistance switching RAM cells 153 and leaves these two sizes of cells with different heights. The CMP process may stop on dielectric top layer 112 in peripheral area 133. In some of these teachings, the CMP process uses a ceria slurry.

Act 2239 is forming etch stop layer 109 over the surface produced by the CMP process of act 2235 as shown in FIG. 17. Act 2241 is forming a mask as shown in FIG. 17 and etching to remove etch stop layer 109, dielectric fill layer 112, and dielectric top layer 113 from peripheral area 133 as shown in FIG. 18.

Act 2243 is depositing inter-level dielectric 103 as shown in FIG. 19. Act 2245 is planarizing inter-level dielectric 103 as shown in FIG. 20.

Act 2247 is forming openings through inter-level dielectric 103 and etch stop layer 113 and back filling with metal to form vias 105, 151, 145 and metal features 101 as shown in FIG. 2. Act 2249 is additional processing to complete BEOL processing and the formation of a device such as IC device 100.

Some aspects of the present teaching relate to an integrated circuit (IC) device that includes, a substrate, a metal interconnect structure formed over the substrate, a plurality of resistance switching random access memory (resistance switching RAM) cells formed within the metal interconnect structure. Each resistance switching RAM cell includes a bottom electrode, a top electrode, and a resistance switching structure between the bottom electrode and the top electrode. Vias connect the top electrodes to the metal interconnect structure. The vias pass through a low κ dielectric layer. The plurality of resistance switching RAM cells includes smaller cells and larger cells. The smaller cells are shorter in height than the larger cells. Any dielectric layers separating the top electrodes from the low κ dielectric layer have equal thickness over the larger cells and the smaller cells.

Some aspects of the present teaching relate to an integrated circuit (IC) device that includes, a substrate, a metal interconnect structure formed over the substrate, and a plurality of resistance switching random access memory (resistance switching RAM) cells formed within the metal interconnect structure. Each resistance switching RAM cell includes a bottom electrode, a top electrode, and a resistance switching structure between the bottom electrode and the top electrode. Vias passing through a low κ dielectric layer connect the top electrodes to the metal interconnect structure. The plurality of resistance switching RAM cells includes smaller cells and larger cells wherein the smaller cells have lower heights that than the larger cells. For each of the plurality of resistance switching RAM cells, the etch stop layer extends laterally away from the resistance switching RAM cell and any sidewall spacers associated with the resistance switching RAM cell.

Some aspects of the present teaching relate to a method of manufacturing an integrated circuit (IC) device. The method includes forming a metal interconnect layer over a semiconductor substrate that includes a memory area and a peripheral area and forming resistance switching random access memory (resistance switching RAM) cells over the metal interconnect layer in the memory area. The resistance switching RAM cells include taller cells and shorter cells. The method further includes depositing a first dielectric layer over the resistance switching RAM cells, depositing a second dielectric layer over the first dielectric layer, and chemical mechanical polishing to leave a surface that includes top electrodes of the taller cells, top electrodes of the shorter cells, and the second dielectric layer in areas between resistance switching RAM cells. The chemical mechanical polishing leaves the taller cells taller than the shorter cells.

The foregoing outlines features of several embodiments so that those skilled in the art may better understand the aspects of the present teachings. Those skilled in the art should appreciate that they may readily use the present teachings as a basis for designing or modifying other processes and structures for carrying out the same purposes and/or achieving the same advantages of the embodiments introduced herein. Those skilled in the art should also realize that such equivalent constructions do not depart from the spirit and scope of the present teachings, and that they may make various changes, substitutions, and alterations herein without departing from the spirit and scope of the present teachings.

What is claimed is:

1. An integrated circuit (IC) device, comprising:
   a substrate;
   a metal interconnect structure formed over the substrate;
   a plurality of resistance switching random access memory (resistance switching RAM) cells formed within the metal interconnect structure, each resistance switching RAM cell comprising a bottom electrode, a top electrode, and a resistance switching structure between the bottom electrode and the top electrode; and
   vias connecting the top electrodes to the metal interconnect structure, wherein the vias pass through a low κ dielectric layer;
   wherein the plurality of resistance switching RAM cells includes smaller cells and larger cells;
   the smaller cells are shorter in height than the larger cells; and
   any dielectric layers separating the top electrodes from the low κ dielectric layer have equal thickness over the larger cells and the smaller cells.

2. The IC of claim 1, wherein an etch stop layer separates the top electrodes from the low κ dielectric layer.

3. The IC of claim 2, wherein an amount by which the smaller cells are lower in height than the larger cells is of a same order of magnitude as a thickness of the etch stop layer.

4. The IC of claim 2, wherein an amount by which the smaller cells are lower in height than the larger cells is at least one fourth a thickness of the etch stop layer.

5. The IC of claim 2, wherein:
   the plurality of resistance switching RAM cells form one or more arrays in a memory area, including a first array;
   the etch stop layer overlies a second dielectric layer in the memory area;
   the second dielectric layer is located between the resistance switching RAM cells in the first array but is spaced apart from each of the resistance switching RAM cells in the first array.

6. The IC of claim 5, wherein the second dielectric layer forms islands located on diagonals between the resistance switching RAM cells in the first array.

7. The IC of claim 2, wherein for each of the plurality of resistance switching RAM cells the etch stop layer extends laterally away from the resistance switching RAM cell including any sidewall spacers associated with the resistance switching RAM cell.

8. An integrated circuit (IC) device, comprising:
   a substrate;
   a metal interconnect structure formed over the substrate;
   a plurality of resistance switching random access memory (resistance switching RAM) cells formed within the metal interconnect structure, each resistance switching RAM cell comprising a bottom electrode, a top electrode, and a resistance switching structure between the bottom electrode and the top electrode; and
   vias connecting the top electrodes to the metal interconnect structure, wherein the vias pass through a low κ dielectric layer and an etch stop layer;
   wherein the plurality of resistance switching RAM cells includes smaller cells and larger cells;

the etch stop layer is between the low κ dielectric layer and the resistance switching RAM cells;
the smaller cells have lower heights that than the larger cells; and
for each of the plurality of resistance switching RAM cells, the etch stop layer extends laterally away from the resistance switching RAM cell including any sidewall spacers associated with the resistance switching RAM cell.

9. The IC of claim 8, wherein the etch stop layer levels off at a height of the smaller cells between the larger cells in an array of the larger cells.

10. The IC of claim 9, wherein;
a first dielectric layer fills space between the larger cells in the array; and
a second dielectric layer is located on top of the first dielectric layer and below the etch stop layer in areas between the larger cells in the array.

11. The IC of claim 10, wherein the second dielectric layer is present midway between diagonally adjacent larger cells in the array.

12. The IC of claim 10, wherein the etch stop layer levels off over the second dielectric layer.

13. An integrated circuit (IC) device, comprising:
a substrate;
a metal interconnect structure formed over the substrate;
memory cells within the metal interconnect structure, each memory cell comprising a bottom electrode, a top electrode, and a data storage structure between the bottom electrode and the top electrode;
an oxide layer between the memory cells; and
a dielectric layer directly over the oxide layer;
wherein the memory cells comprise first cells having a first height and second cells having a second height;
a combined thickness of the oxide layer and the dielectric layer is greater than or equal to the first height; and
the combined thickness of the oxide layer and the dielectric layer is less than or equal to the second height.

14. The IC device of claim 13, further comprising:
an etch stop layer;
wherein the etch stop layer is over and in contact with the top electrodes of the first cells, the top electrodes of the second cells, and the dielectric layer.

15. The IC device of claim 14, wherein a difference between the first height and the second height is at least one fourth a thickness of the etch stop layer.

16. The IC device of claim 13, wherein the dielectric layer comprises silicon oxynitride (SiON), silicon nitride (SiN), silicon cyanide (SINC), or silicon oxycarbide (SiOC).

17. The IC device of claim 13, wherein the dielectric layer forms islands between the memory cells.

18. The IC device of claim 13, wherein the oxide layer rises adjacent the memory cells such that the oxide layer laterally separates the dielectric layer from the memory cells.

19. The IC device of claim 13, further comprising:
an etch stop layer;
wherein a bottom of the etch stop layer is vertically aligned with tops of the first cells adjacent the first cells and is vertically aligned with tops of the second cells adjacent the second cells.

20. The IC device of claim 19, wherein the etch stop layer is directly over and in contact with the dielectric layer.

* * * * *